United States Patent [19]

Galbraith

[11] Patent Number: 5,341,030
[45] Date of Patent: Aug. 23, 1994

[54] METHODS FOR PROTECTING OUTPUTS OF LOW-VOLTAGE CIRCUITS FROM HIGH PROGRAMMING VOLTAGES

[75] Inventor: Douglas C. Galbraith, Fremont, Calif.

[73] Assignee: Actel Corporation, Sunnyvale, Calif.

[21] Appl. No.: 58,998

[22] Filed: May 6, 1993

Related U.S. Application Data

[63] Continuation of Ser. No. 738,209, Jul. 31, 1991, abandoned.

[51] Int. Cl.$^5$ ............................................. H01H 37/76
[52] U.S. Cl. ................................. 307/202.1; 307/465
[58] Field of Search ................. 307/202.1, 465, 272.2, 307/350, 296.4

[56] References Cited

U.S. PATENT DOCUMENTS

| | | | |
|---|---|---|---|
| 4,829,203 | 5/1989 | Ashmore, Jr. | 307/468 |
| 4,873,459 | 10/1989 | El Gamal et al. | 307/465 |
| 4,916,334 | 4/1990 | Hinagawa et al. | 307/296.5 |
| 4,956,569 | 9/1990 | Olivo et al. | 307/296.5 |
| 4,987,327 | 1/1991 | Fernandez et al. | 307/296.5 |
| 5,015,885 | 5/1991 | El Gamal et al. | 307/465 |
| 5,030,845 | 7/1991 | Love et al. | 307/296.5 |
| 5,194,759 | 3/1993 | El-Ayat et al. | 307/202.1 |

FOREIGN PATENT DOCUMENTS 0350461  6/1989  European Pat. Off. .

OTHER PUBLICATIONS

IBM Technical Disclosure Bulletin, "5-Volt Signal Level Shifter In A 3-Volt CMOS Circuit", Dec. 1989, vol. 32, No. 7.

*Primary Examiner*—Timothy P. Callahan
*Assistant Examiner*—Terry D. Cunningham
*Attorney, Agent, or Firm*—D'Alessandro, Frazzini & Ritchie

[57] ABSTRACT

A method for isolating a first low-voltage circuit node comprising an output of a low-voltage device from a second circuit node which carries high programming voltages during programming of user-programmable interconnect elements includes the step of raising the normal power supply voltage provided to the low-voltage devices to an intermediate level lower than the programming voltage but high enough to protect the outputs of the low voltage devices from damage. The output to be protected is caused to assume a desired state and is then inhibited from changing state during the programming cycle. Programming voltage is then applied to the low voltage circuit node.

2 Claims, 1 Drawing Sheet

METHODS FOR PROTECTING OUTPUTS OF LOW-VOLTAGE CIRCUITS FROM HIGH PROGRAMMING VOLTAGES

RELATED APPLICATIONS

This application is a file wrapper-continuation of co-pending application Ser. No. 07/738,209, filed Jul. 31, 1991 now abandoned.

BACKGROUND OF THE INVENTION

1. Field of the Invention

The present invention relates to user-configurable integrated circuits. More particularly, the present invention relates to user-configurable integrated circuits including logic circuits fabricated from low-voltage devices having relatively low breakdown voltages disposed on the same integrated circuit substrate as user-programmable interconnect elements which are programmed by application of a programming voltage in excess of the voltage which can be withstood by the low-voltage devices. In such integrated circuits, both the inputs and outputs of such low-voltage devices are typically connected to circuit nodes common to one or more of the user-programmable interconnect elements. The present invention includes methods for preventing damage to the outputs of the low-voltage devices during the application of high voltage while programming the user-programmable interconnect elements.

2. The Prior Art

Presently-known user-configurable integrated circuits which employ user-programmable interconnect elements programmed by application of a relatively high programming voltage to the user-programmable interconnect elements require some form of isolation between the circuit nodes to which the high programming voltage is applied and other circuit nodes connected to the outputs of low-voltage devices, such as low-voltage MOS transistors, which are used in the functional circuitry of the integrated circuits.

Examples of such user-configurable integrated circuits include the ACT-1xxx family of user-configurable gate array integrated circuits manufactured and marketed by Actel Corporation of Sunnyvale, Calif., assignee of the present application. These integrated circuits employ isolation structures to connect the outputs of low-voltage devices comprising the logic circuits in the array to the array of antifuses which are programmed by a user to interconnect the low-voltage circuits in a desired manner.

The isolation structure used in these products acts to disconnect the outputs of the low-voltage logic circuits from the antifuse array during programming of the antifuses in order to protect the low-voltage devices against destruction resulting from transistor breakdown mechanisms caused by application of the high programming voltage. While this isolation circuit structure is useful to prevent damage to the low-voltage logic circuits during antifuse programming, it presents several problems.

First, the current isolation structure requires a charge pump to generate the voltages necessary for its operation. Charge pumps take up space on the integrated circuit die layout and add standby power to the integrated circuit operating requirements. The provision of charge pump circuits creates circuit layout problems because of the high-voltage considerations, and otherwise complicates the design of the integrated circuit.

One such problem created by charge pump circuits is that the pump line is inherently a VTIF line for a parasitic MOS field device. This type of line creates a layout problem because its polysilicon can only comprise a single gate. If two or more gates are connected to such a line, they must be broken by a metal jumper which breaks a parasitic MOS field device. Providing jumpers consumes additional layout area and blocks metal routing paths. Since a pump line typically runs to all inputs and outputs of functional circuit modules in a user-configurable circuit array, many jumpers are required.

In addition, the isolation circuit structure inherently produces a power-inrush current which must be controlled by providing high-power charge pumps and shut-down logic. These circuits add further to the standby power dissipation of the integrated circuit, occupy additional area on the integrated circuit die, and further complicate the design.

Finally, since this isolation device is in the signal path when the integrated circuit is not in a programming cycle, it acts as a delay element in series with the data path, thus slowing down the performance of the integrated circuit.

Given the proliferation of user-configurable integrated circuits which utilize user-programmable interconnect elements which require programming voltages higher than the breakdown voltages of the low-voltage MOS transistors used to configure the operating circuitry on the integrated circuit, there is a need for circuitry which functions during programming to isolate circuit nodes carrying high programming voltages from circuit nodes configured from low-voltage devices.

BRIEF DESCRIPTION OF THE INVENTION

According to the present invention, a method for protecting a low voltage transistor connected to a first low-voltage circuit node from high programming voltages carried on a second circuit node during programming of user-programmable interconnect elements includes the step of raising the normal power supply voltage provided to the low-voltage devices to an intermediate level lower than the programming voltage but high enough to protect the outputs of the low voltage devices from damage. The output to be protected is caused to assume a desired state and is then inhibited from changing state during the programming cycle. Programming voltage is then applied to the low voltage circuit node.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
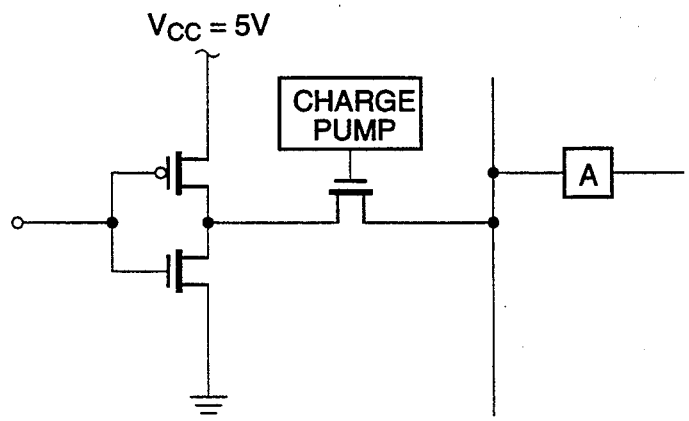
FIG. 1 is a schematic diagram of the output portion of a low-voltage logic circuit including a prior-art circuit used to isolate and protect the output of the low voltage logic circuit from a circuit node which may be raised to a high programming voltage.

Referring first to FIG. 1, a prior art approach to the problem solved by the present invention may be illustrated. In the schematic diagram of FIG. 1, a conventional output buffer section of a low voltage logic circuit includes a well-known CMOS inverter including a P-channel MOS transistor in series with an N-channel MOS transistor. The input to the inverter is the common gates of the two transistors and its output is taken from the common connection of the drains of the two devices.

Under normal operating circuit conditions, it is desired to connect the output of the inverter to a circuit node (shown as the vertical conductor) to which a user-programmable element such as an antifuse element (shown symbolically as a square containing the letter "A") is connected. A user may wish to program the antifuse to create a connection between the circuit nodes to which the antifuse element is connected. In this case, the user supplies a high programming voltage $V_{PP}$ across the antifuse element. The programming voltage $V_{PP}$ may be applied such that the $V_{PP}$ potential is applied to the circuit node to the left of the antifuse as shown in FIG. 1 and ground potential is applied to the right side of the antifuse. This high programming voltage $V_{PP}$ is normally in excess of the voltage which can be withstood by the inverter transistors.

The prior-art solution to this problem is to place a high-voltage transistor between the output of the inverter and the antifuse circuit node. The gate of the high voltage transistor is driven from a charge pump. During a programming cycle for the antifuse, the high-voltage transistor is turned off, isolating the output of the inverter from the antifuse node, thus protecting the inverter output from the effects of the high programming voltage. During normal circuit operation, the high-voltage transistor is turned on, thus connecting the output of the inverter to the antifuse node.

Those of ordinary skill in the art will realize that the high-voltage transistor has an on resistance of about 100 Ω. In a practical user-configurable integrated circuit, there will be many such low-voltage circuits which need to be isolated from circuit nodes which will carry programming voltage during a device programming cycle. As a result, a significant portion of the impedance through a plurality of such low-voltage circuits will be contributed by the isolation devices.

Figure 2:
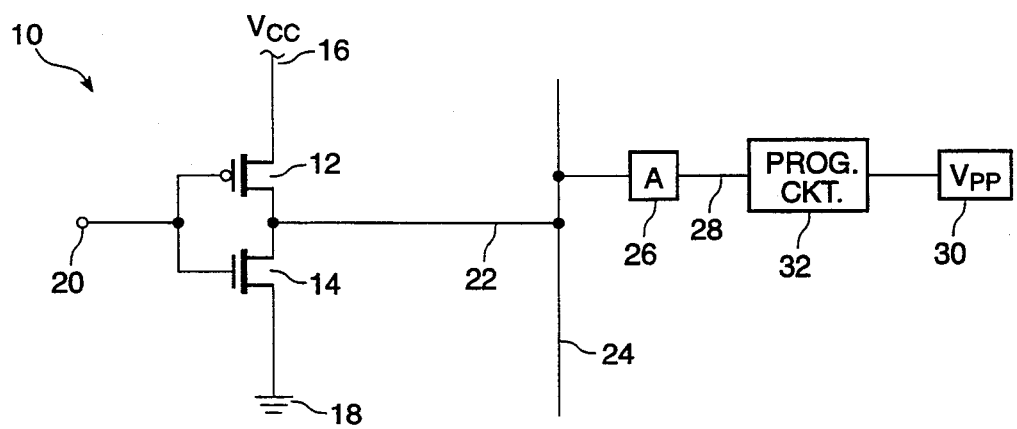
FIG. 2 is a schematic diagram of the output portion of a low-voltage logic circuit illustrating the method according to the present invention for isolating and protecting the output of the low voltage logic circuit from the voltage present on a circuit node which may be raised to a high programming voltage.

Referring now to FIG. 2, a typical CMOS output buffer circuit illustrates a method for protecting low-voltage devices from programming voltage according to the present invention. Like the output buffer of the prior art circuit, output buffer 10 includes a P-channel MOS transistor device 12 and an N-channel MOS transistor 14 connected in series between a voltage source having a first voltage potential $V_{CC}$ (at reference numeral 16) and a second potential at ground potential (at reference numeral 18). The gates of MOS transistors 12 and 14 are connected together to an input node 20 for the output buffer 10, connected to upstream circuitry (not shown). The commonly connected drains of the MOS transistors 12 and 14 form the output node 22 of the output buffer 10. The output node 22 of the output buffer 10 is connected to a conductor 24 to which one end of one or more user-programmable elements (shown illustratively as antifuse 26) is connected. The other end of antifuse 26 is shown connected to a circuit node 28. A programming voltage source 30 is connected to node 28, either directly or indirectly through a programming path including other circuitry 32. For simplicity, the other circuitry 32 comprising a portion of the programming path is shown simply as a block, but those of ordinary skill will recognize that it may be any of the circuitry conventionally found in integrated circuits containing antifuse arrays, such as steering and switching circuitry for delivering a programming voltage $V_{PP}$ from the programming voltage source 30 to the antifuse. Those of ordinary skill in the art will recognize that programming voltage source 30 may be either of the conventional programming voltage sources employed in antifuse architectures, i.e., an on-chip charge pump or an off-chip voltage source coupled through an I/O pin to the chip.

Under normal circuit operating conditions, the potential difference between first voltage potential $V_{CC}$ and second potential ground will typically be 5 volts, but at any rate it will be at a value less than the breakdown voltages for the MOS transistors 12 and 14. Similarly, the voltage appearing at output node 22 of output buffer 10 will be at a value between first voltage potential $V_{CC}$ and second potential ground under normal circuit operating conditions.

During a programming cycle for the antifuse 26, a programming precharge voltage potential $V_{PP}/2$, usually equal to about 9 volts, is likely to appear on conductor 24 and thus will also appear on output node 22. A properly designed programming algorithm prevents $V_{PP}$ from appearing on output node 22.

If the $V_{PP}/2$ potential appears on output node 22, it is likely to damage the transistors MOS 12 and/or 14. According to the method of the present invention, the voltage potential $V_{CC}$ is raised to a value which will protect the MOS transistors 12 and 14. According to a presently preferred embodiment of the invention, $V_{CC}$ is raised to a value of about $V_{PP}/2$. Those of ordinary skill in the art will readily recognize that this step may be easily implemented by programming the $V_{CC}$ voltage-raising step into the programmer unit which is connected to the integrated circuit to program the antifuses. Most commercially-available programming equipment has this capability built into it and the operation of such features is disclosed in the manufacturer's literature. If a process technology is used where the $V_{BDSS}$ value of a typical N-channel MOS transistor is greater than 10 volts, a typical $V_{BDSS}$ value for a P-channel MOS transistor is about 16 volts, and a programming voltage $V_{PP}$ value of 18 volts is used, $V_{PP}/2=9$ volts, a value less than $V_{BDSS}$ Of the N-channel MOS transistor. Those of ordinary skill in the art will appreciate that the value to which $V_{CC}$ is raised may be changed to accommodate the breakdown voltage values of P-channel and N-channel MOS transistors fabricated using other process technologies.

One constraint which applies when using the method of the present invention is that the $V_{BII}$ breakdown voltage of the N-channel MOS transistor is less than $V_{PP}/2$. Because of this constraint, $V_{CC}$ must be less than $V_{BII}$ when the outputs are switched. As long as the output state does not change while the voltage $V_{PP}$ is present on output node 22, $V_{CC}$ may be raised to $V_{BDSS}$.

In certain applications, internal functional circuitry in the integrated circuit is used to program the user-programmable element and must be set to a desired logic state. If such internal circuitry is used, the order of application of voltages according to the present invention is important. According to a presently preferred embodiment of the invention, internal circuitry supplied in the integrated circuit containing the circuitry shown in FIG. 2 is first used to set the output node 22 to the logic state required to program the antifuse 26 connected to output node 22 (i.e., if the output of output buffer 10 is set to a logic zero, $V_{PP}$ can be applied to node 28 to program antifuse 26). Next, $V_{CC}$ is raised to its higher intermediate value according to the present invention. Finally, the programming voltage $V_{PP}$ is applied to node 28.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a user-programmable integrated circuit having an operating mode and a programming mode, said integrated circuit including at least one low-voltage N-Channel MOS transistor having a characteristic $V_{BDSS}$ breakdown voltage value and connected to a low-voltage circuit node, said at least one low-voltage N-Channel MOS transistor operated from a first power supply voltage supplied to a power supply node during said operating mode of said integrated circuit, said integrated circuit further including user-programmable interconnect elements connected to said low-voltage circuit node, a method for protecting said at least one low-voltage N-Channel MOS transistor from the effects of a programming voltage higher than said first power supply voltage and present on said low-voltage circuit node during said programming mode of said integrated circuit, including the steps of:

applying a second power supply voltage to said power supply node, said second power supply voltage higher than said first power supply voltage and lower than said programming voltage, said second power supply voltage being high enough to protect said at least one low-voltage N-Channel MOS transistor from $V_{BDSS}$ breakdown damage caused by said programming voltage; and supplying said programming voltage to said user-programmable interconnect elements.

2. In a user-programmable integrated circuit having an operating mode and a programming mode, said integrated circuit including at least one low-voltage N-Channel MOS transistor having a characteristic $V_{BDSS}$ breakdown voltage value and connected to a low-voltage circuit node, said at least one low-voltage N-Channel MOS transistor operated from a first power supply voltage supplied to a power supply node during said operating mode of said integrated circuit, said integrated circuit further including user-programmable interconnect elements connected to said low-voltage circuit node, a method for protecting said at least one low-voltage N-Channel MOS transistor from the effects of a programming voltage higher than said first power supply voltage and present on said low-voltage circuit node during said programming mode of said integrated circuit, including the steps of:

applying a second power supply voltage to said power supply node, said second power supply voltage higher than said first power supply voltage and lower than said programming voltage, said second power supply voltage being high enough to protect said user circuit from $V_{BDSS}$ breakdown damage caused by said programming voltage and maintaining said second power supply voltage during the programming of said selected user-programmable element;

supplying a high programming voltage to said user-programmable interconnect element; and maintaining said low-voltage N-Channel MOS transistor in a static state while said second power supply voltage is applied thereto.

* * * * *

UNITED STATES PATENT AND TRADEMARK OFFICE
CERTIFICATE OF CORRECTION

PATENT NO. : 5,341,030
DATED : August 23, 1994
INVENTOR(S) : Douglas C. Galbraith It is certified that error appears in the above-indentified patent and that said Letters Patent is hereby corrected as shown below:

On Col. 4, line 33, replace "transistors MOS" with ---MOS transistors---.
On Col. 4, line 51, replace "Of" with ---of---.

Signed and Sealed this

Sixth Day of December, 1994

Attest:

BRUCE LEHMAN

*Attesting Officer*           *Commissioner of Patents and Trademarks*